United States Patent
Pan et al.

(10) Patent No.: US 8,730,563 B2
(45) Date of Patent: May 20, 2014

(54) POTASSIUM CHLOROBORATE NONLINEAR OPTICAL CRYSTAL, PREPARATION METHOD AND USE THEREOF

(75) Inventors: Shilie Pan, Urumqi (CN); Hongping Wu, Urumqi (CN); Xueling Hou, Urumqi (CN)

(73) Assignee: The Xinjiang Technical Institute of Physics and Chemistry, Chinese Academy of Sciences, Urumqi (CN)

( * ) Notice: Subject to any disclaimer, the term of this patent is extended or adjusted under 35 U.S.C. 154(b) by 0 days.

(21) Appl. No.: 13/383,743

(22) PCT Filed: Jan. 12, 2011

(86) PCT No.: PCT/CN2011/000053
§ 371 (c)(1),
(2), (4) Date: Jan. 12, 2012

(87) PCT Pub. No.: WO2012/019418
PCT Pub. Date: Feb. 16, 2012

(65) Prior Publication Data
US 2012/0188630 A1    Jul. 26, 2012

(30) Foreign Application Priority Data
Aug. 11, 2010    (CN) .......................... 2010 1 0250911

(51) Int. Cl.
*G02F 1/35*    (2006.01)
(52) U.S. Cl.
USPC .......................... 359/326; 385/122; 359/328

(58) Field of Classification Search
USPC .................. 359/326–332; 385/122
See application file for complete search history.

(56) References Cited

U.S. PATENT DOCUMENTS 8,293,008 B2 * 10/2012 Pan et al. .................... 117/13

FOREIGN PATENT DOCUMENTS

| CN | 101498040 A | 8/2009 |
| CN | 101914809 A | 12/2010 |
| JP | 9-33964 A | 2/1997 |

* cited by examiner

*Primary Examiner* — Daniel Petkovsek
(74) *Attorney, Agent, or Firm* — Barry L. Davison; Davis Wright Tremaine LLP

(57) ABSTRACT

The present invention relates to a potassium chloroborate nonlinear optical crystal, a preparation method and a use thereof. The crystal has a chemical formula of $K_3B_6O_{10}Cl$, has no symmetric center, belongs to rhombohedral crystal system, has a space group R3m with unit cell parameters of a=10.0624(14) Å, b=10.0624(14) Å, c=8.8361(18) Å, Z=3 and V=774.8(2) Å³. It has a powder second harmonic generation efficiency of about 3 times that of KDP ($KH_2PO_4$), and a Mohs hardness of 4-5, a transparent wavelength range of 165 nm-3460 nm. The compound is synthesized by a solid-state reaction and the crystal is grown by using a flux, which are of easy operation and low costs. The obtained crystal has large size, short growing period, little inclusion, relatively high mechanical hardness, and is easy to be cut, polished and stored. Said crystal is used to generate a second, third, fourth or fifth harmonic light output for a laser beam with a wavelength of 1064 nm.

8 Claims, 1 Drawing Sheet

POTASSIUM CHLOROBORATE NONLINEAR OPTICAL CRYSTAL, PREPARATION METHOD AND USE THEREOF

CROSS-REFERENCE TO RELATED APPLICATIONS

This application is a 371 of PCT/CN2011/000053 dated 12 Jan. 2011, which claims the benefit of priority under 35 U.S.C. 119 to Application Serial No. 201010250911.1, filed 11 Aug. 2010 in the State Intellectual Property Office of the People's Republic of China, both of which are incorporated by reference herein in their entirety

FIELD OF THE INVENTION

The present invention relates to a crystal, a preparation method and a use thereof. Particularly, the present invention relates to a potassium chloroborate nonlinear optical crystal, a method for preparing said crystal and a use thereof.

BACKGROUND OF THE INVENTION

Nonlinear optical crystal is one of the important photoelectric information functional materials, the important material basis of photoelectric technique especially laser technique. Nonlinear optical crystal is useful in conversion of laser frequency, broadening the wavelengths of lasers; regulating the intensity and phase of laser; attaining the holographic storage of laser signal, avoiding the self-pumped phase conjugation of distorted wavefront, etc. Accordingly, nonlinear optical crystal is an essential material in the advanced technique and modern military technique, whereby is put in the preferential development position in developed countries, and scheduled in the high technique development plans as an important strategic measure with high attention and supporting.

With the development of laser technology from 1960's up to date, the nonlinear optical crystal has been rapidly developed. Meanwhile, several nonlinear optical crystals such as, lithium niobate, potassium dihydrogen phosphate, potassium dideuterium phosphate, lithium iodinate, potassium titanium phosphate, barium metaborate, lithium triborate, potassium niobate, cesium borate, lithium cesium borate, beryllium potassium fluoroborate, etc. have been developed increasingly since the first quartz frequency multiplication crystal, and been widely used in the fields of second harmonic generation, sum-frequency, difference-frequency, optical parametric amplification as well as electro-optical modulation and electro-optical deflection, etc.

Development of all-solid-state deep ultraviolet (200 nm) coherent light sources is one of the most advanced research projects in the current international photoelectron field, because of the exceedingly important applications of ultraviolet laser in varieties of high technique fields, such as, the requirements of all-solid-state ultraviolet coherent light sources in the new generation of integrate circuit; the active demand in the photoelectron energy spectroscopy and spectroscopy techniques for tunable all-solid-state ultraviolet light sources, which will play an essential role in promoting the development of deep ultraviolet spectrum and energy spectrometer and will create a new researching field of material science; and also the great potential of driving the progress of the laser fine machining. Since no laser crystal which outputs deep ultraviolet wavelength has been developed, the key point of solving the solid-state deep ultraviolet source is focused on the development and application of NLO frequency conversion crystals in ultraviolet wavelength range. In these circumstances, the present inventors have conducted intensive studies and finally found a new nonlinear crystal $K_3B_6O_{10}Cl$ capable of attaining a 4-harmonic generation of 1064 nm.

SUMMARY OF THE INVENTION

One object of the present invention is to provide a potassium chloroborate nonlinear optical crystal in order to meet the requirement of crystal materials with non-linear optical effect in full-solid-state ultraviolet laser system.

Another object of the present invention is to provide a method for preparing a potassium chloroborate nonlinear optical crystal.

Yet another object of the present invention is to provide a use of the potassium chloroborate nonlinear optical crystal.

The technical solution of the present invention is as follows.

The invention provides a potassium chloroborate nonlinear optical crystal. The potassium chloroborate nonlinear optical crystal is a nonlinear optical crystal with a large centimeter-grade size and has a chemical formula of $K_3B_6O_{10}Cl$, as well as a molecular weight of 377.61, it has no symmetric center and belongs to rhombohedral crystal system, has a space group R3m with unit cell parameters of a=10.0624(14) Å, b=10.0624(14) Å, c=8.8361(18)Å, Z=3 and V=774.8(2) Å$^3$, and has a Mohs hardness of 4~5.

The invention provides a method for preparing a potassium chloroborate nonlinear optical crystal wherein the potassium chloroborate nonlinear optical crystal is grown by using a flux, and the method comprises the steps of:

a. mixing a single-phase polycrystalline powder of a potassium chloroborate compound with a flux at a molar ratio of 1:2~8 uniformly, heating the obtained mixture gradually to 680~850° C. at a temperature-increasing rate of 1~30° C./h, and maintaining this temperature for 5~100 hours to obtain a mixed melting liquid;

or weighing a starting material for preparing potassium chloroborate according to a molar ratio directly, and then mixing the starting material for preparing potassium chloroborate with a flux at a molar ratio of 1:2~8 uniformly, heating the obtained mixture to 680~850° C. at a temperature-increasing rate of 1~30° C./h, and maintaining this temperature for 5~100 hours to obtain a mixed melting liquid;

the starting material for preparing a potassium chloroborate single-phase polycrystalline powder and the formulation thereof is as follows:

formulation 1: a potassium-containing starting material A, KCl and a boron-containing compound at a molar ratio of 1:1:6, wherein the potassium-containing material A is potassium carbonate or potassium oxide; the boron-containing compound is boronic acid or boron oxide;

formulation 2: a potassium-containing starting material B, KCl and boronic acid at a molar ratio of 2:1:6, wherein the potassium-containing material B is potassium nitrate, potassium hydroxide or potassium bicarbonate;

formulation 3: a potassium-containing starting material C, KCl and boron oxide at a molar ratio of 2:1:3, wherein the potassium-containing material C is potassium nitrate, potassium hydroxide or potassium bicarbonate;

formulation 4: a potassium-containing starting material D, KCl and boron oxide at a molar ratio of 1:1:3, wherein the potassium-containing material D is potassium bicarbonate, potassium oxide or potassium oxalate;

the flux is KF, $K_2O$, PbO or KF—PbO;

b. reducing the temperature of the mixed melting liquid to 655~750° C., introducing the lower end of a seed crystal rod under the surface of the mixed melting liquid, reducing the temperature slowly by 5~100° C. at a rate of 0.5~10° C./h, lifting the seed crystal rod with an aggregate at its lower end out of the liquid surface, and then reducing to room temperature at a rate of 0~12° C./h to obtain a potassium chloroborate seed crystal which aggregates at the lower end of the seed crystal rod;

c. putting a crucible containing the mixed melting liquid obtained in step a into a crystal growing furnace, and loading the seed crystal obtained in step b from the top of the furnace, after 5~60 min of preheating, contacting the seed crystal with the mixed melting liquid surface or lowering it into the mixed melting liquid for remelting, holding the temperature for 5~60 min, and then reducing to saturation temperature at a rate of 1~60° C./h;

d. further reducing the temperature at a rate of 0.1~5° C./day while rotating the seed crystal rod or the crucible at a rotation speed of 0~100 rpm for crystal growing, after the single crystal has grown up to the desired size, lifting the crystal out of the melting liquid surface and reducing the temperature to room temperature at a rate of 1~80° C./h, and then removing the crystal from the furnace, thus obtaining a potassium chloroborate nonlinear optical crystal.

The single-phase polycrystalline powder of the potassium chloroborate compound is prepared by a solid-state reaction with the steps of:

subjecting the starting material for preparing a single-phase polycrystalline powder of potassium chloroborate compound at a molar ratio of K:Cl:B=3:1:6 to: uniformly mixing, grinding followed by heating at 350° C. for 24 hours in a muffle furnace, cooling to room temperature; the second grinding, heating at 600° C. for 24 hours in a muffle furnace, cooling to room temperature; the third grinding, heating at 720° C. for 48 hours in a muffle furnace, cooling to room temperature; removing and grinding so as to obtain a completely sintered single-phase polycrystalline powder of a potassium chloroborate compound.

The single-phase polycrystalline powder of the potassium chloroborate compound can be prepared according to the following reaction equations:

(1) $K_2CO_3+KCl+6H_3BO_3 \rightarrow K_3B_6O_{10}Cl+CO_2\uparrow+9H_2O\uparrow$
(2) $2KNO_3+KCl+6H_3BO_3 \rightarrow K_3B_6O_{10}Cl+NO_2\uparrow+NO\uparrow+9H_2O\uparrow+O_2\uparrow$
(3) $K_2O+KCl+6H_3BO_3 \rightarrow K_3B_6O_{10}Cl+9H_2O\uparrow$
(4) $2KOH+KCl+6H_3BO_3 \rightarrow K_3B_6O_{10}Cl+10H_2O\uparrow$
(5) $2KHCO_3+KCl+6H_3BO_3 \rightarrow K_3B_6O_{10}Cl+2CO_2\uparrow+10H_2O\diamond$
(6) $K_2CO_3+KCl+3B_2O_3 \rightarrow K_3B_6O_{10}Cl+CO_2\uparrow$
(7) $2KNO_3+KCl+3B_2O_3 \rightarrow K_3B_6O_{10}Cl+NO_2\uparrow+NO\uparrow+O_2\uparrow$
(8) $K_2O+KCl+3B_2O_3 \rightarrow K_3B_6O_{10}Cl$
(9) $2KOH+KCl+3B_2O_3 \rightarrow K_3B_6O_{10}Cl+H_2O\uparrow$
(10) $2KHCO_3+KCl+3B_2O_3 \rightarrow K_3B_6O_{10}Cl+2CO_2\uparrow+H_2O\uparrow$
(11) $K_2C_2O_4 \cdot H_2O+KCl+3B_2O_3 \rightarrow K_3B_6O_{10}Cl+CO_2\uparrow+CO\uparrow+H_2O\uparrow$.

The potassium-containing compound is $K_2O$, $K_2CO_3$, $KNO_3$, $K_2C_2O_4 \cdot H_2O$, KOH, $KC_2H_3O_2$ or $KHCO_3$; the chlorine-containing compound is KCl; the boron-containing compound is $H_3BO_3$ or $B_2O_3$.

The molar ratio of KF to PbO in the KF—PbO flux in step a is 1~5:1~4.

The invention provides a use of the potassium chloroborate nonlinear optical crystal in frequency converting device for laser output of a laser generator.

The invention provides a use of the potassium chloroborate nonlinear optical crystal in generating a second, third, fourth or fifth harmonic light output for a laser beam with a wavelength of 1064 nm.

The invention provides a use of the potassium chloroborate nonlinear optical crystal in the optical parametric and amplifying device from infrared to ultraviolet.

The present potassium chloroborate nonlinear optical crystal, the preparation method and use thereof have the following advantages.

The present invention provides a compound having the chemical formula of $K_3B_6O_{10}Cl$, the nonlinear optical crystal of the compound, and the preparation method and uses thereof. The $K_3B_6O_{10}Cl$ is measured by a powder second harmonic measurement process for the phase-matchability and its powder second harmonic generation efficiency is about 3 times that of KDP, the ultraviolet absorption edge thereof is about 165 nm. The $K_3B_6O_{10}Cl$ crystal can attain a second harmonic of a Nd:YAG (1064 nm), and it is assumed that $K_3B_6O_{10}Cl$ can be used in a harmonic generator for a third, fourth or fifth harmonic of a Nd:YAG laser. In addition, the $K_3B_6O_{10}Cl$ single crystal is a compound from different components melting process, which is colorless and transparent, non-hygroscopic in the atmosphere and stable in chemical properties. Therefore, it can expect that the $K_3B_6O_{10}Cl$ will have a wide application in various nonlinear optical fields and will open a nonlinear optical application in ultraviolet wavelength range.

DETAILED DESCRIPTION OF THE INVENTION

Figure 1:
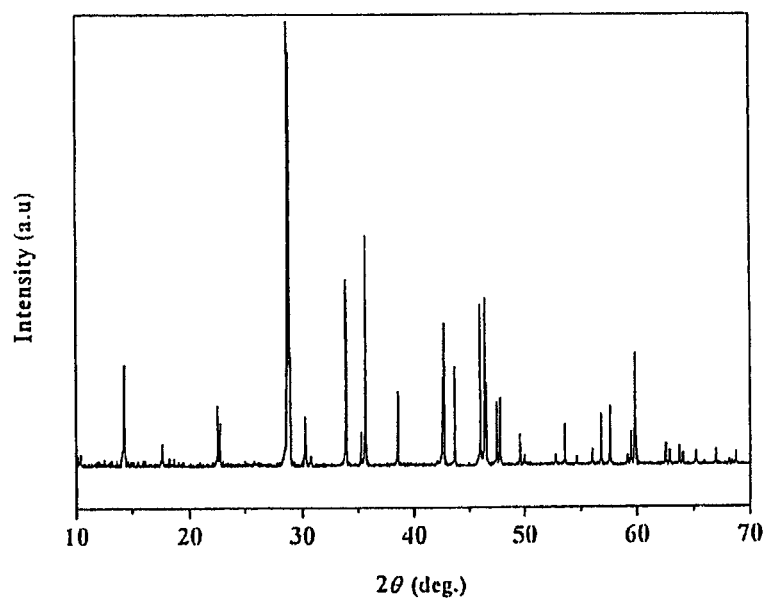
FIG. 1 shows the X-ray powder diffraction pattern of the $K_3B_6O_{10}Cl$ crystal in the invention.
Figure 2:
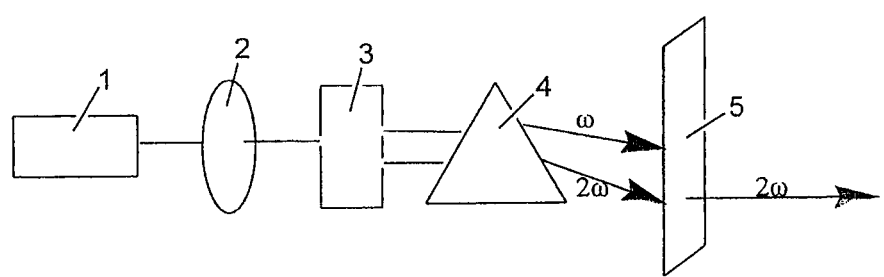
FIG. 2 is a schematic illustration of the processing principle of a nonlinear optical device made from the $K_3B_6O_{10}Cl$ crystal in the invention, wherein, 1 is a laser generator, 2 is an emitted laser beam, 3 is a $K_3B_6O_{10}Cl$ crystal, 4 is an output beam, and 5 is a filter.

The present invention will be described in detail with reference to the drawings and examples below:

Example 1

Preparation of a $K_3B_6O_{10}Cl$ compound according to the following reaction equation:

$K_2O+KCl+6H_3BO_3 \rightarrow K_3B_6O_{10}Cl+9H_2O\diamond$ $K_2O$, KCl and $H_3BO_3$ were put in a mortar at a molar ratio of 1:1:6, mixed and ground carefully, and then charged into a Φ100 mm×100 mm lidless corundum crucible. The crucible was placed in a muffle furnace, heated slowly to 350° C. and held at this temperature for 24 hours. After cooling to room temperature, the crucible was taken out at which time the sample was relatively loose. Subsequently, the sample was removed and ground thoroughly again. Then the sample was heated to 600° C. and held for 24 h, thereafter it was cooled to room temperature followed by grinding, and heated again to 720° C. and held for 48 hours. The sample was then removed and ground slightly in a mortar to yield a completely sintered $K_3B_6O_{10}Cl$ single-phase polycrystalline powder. The product was subjected to X-ray analysis, and the resultant X-ray pattern was consistent with the X-ray pattern obtained from potassium chloroborate $K_3B_6O_{10}Cl$ single crystal structure.

In the above reaction equation, potassium oxide can be replaced by potassium carbonate, potassium nitrate, potassium oxalate, potassium hydroxide or potassium bicarbonate; the boronic acid can be replaced by boron oxide.

The obtained $K_3B_6O_{10}Cl$ single-phase polycrystalline powder and a flux KF were mixed at a molar ratio of $K_3B_6O_{10}Cl:KF=1:3$, then charged into a Φ80 mm×80 mm lidless platinum crucible, and then heated to 780° C. at a rate of 30° C./h and held at this temperature for 15 h to obtain a mixed melting liquid of potassium chloroborate.

The temperature of the mixed melting liquid was further reduced to 725° C.; meanwhile a seed crystal rod was introduced rapidly under the surface of the mixed melting liquid. The temperature was reduced slowly to 625° C. at a rate of 0.5° C./h, then the seed crystal rod with an aggregate was lifted out of the liquid surface, and subsequently, cooled to room temperature at a rate of 10° C./h to obtain a potassium chloroborate seed crystal.

Growing crystal in the compound melting liquid: the obtained $K_3B_6O_{10}Cl$ seed crystal was attached to the seed crystal rod and loaded from the top of a crystal growing furnace. The seed crystal was preheated above the surface of the mixed melting liquid at 730° C. in advance, and then dipped into the liquid surface so that the seed crystal remelted in the mixed melting liquid. After the temperature was maintained for 30 min, it was reduced quickly to a saturation temperature of 720° C.

The temperature was reduced at a rate of 2° C./day while rotating the seed crystal rod at a rotation speed of 5 rpm. After the crystal had completed its growing, it was drawn out of the liquid surface and cooled to room temperature at a rate of 10° C./h, thus a potassium chloroborate ($K_3B_6O_{10}Cl$) nonlinear optical crystal with a size of 36 mm×40 mm×30 mm was obtained.

Example 2

Preparation of a $K_3B_6O_{10}Cl$ compound according to the following reaction equation:

$$2KNO_3+KCl+6H_3BO_3 \rightarrow K_3B_6O_{10}+Cl+NO_2\uparrow+NO\uparrow+9H_2O\uparrow+O_2\uparrow$$

$KNO_3$, KCl and $H_3BO_3$ were weighed at a molar ratio of 2:1:6 directly as starting materials. The weighed starting materials and a flux KF—PbO in which the molar ratio of KF to PbO is 2:1 were mixed at a molar ratio of 1:4, then charged into a Φ80 mm×80 mm lidless platinum crucible, and then heated to 745° C. and held at this temperature for 50 h to obtain a mixed melting liquid of potassium chloroborate.

The temperature of the mixed melting liquid was reduced to 725° C.; meanwhile a seed crystal rod was introduced rapidly under the surface of the mixed melting liquid. The temperature was reduced slowly to 650° C. at a rate of 1° C./h, and then the seed crystal rod with an aggregate was lifted out of the liquid surface. Subsequently, the temperature was reduced to room temperature at a rate of 3° C./h to obtain a potassium chloroborate seed crystal.

In the above reaction equation, the potassium nitrate can be replaced by potassium carbonate, potassium oxide, potassium oxalate, potassium hydroxide or potassium bicarbonate; the boronic acid can be replaced by boron oxide.

The obtained $K_3B_6O_{10}Cl$ seed crystal was attached to the seed crystal rod and loaded from the top of a crystal growing furnace. The seed crystal was preheated above the surface of the mixed melting liquid at 720° C. in advance, and then dipped into the liquid surface so that the seed crystal remelted in the mixed melting liquid. After the temperature was maintained for 30 min, it was reduced quickly to a saturation temperature of 710° C.

The temperature was reduced at a rate of 1° C./day while rotating the seed crystal rod at a rotation speed of 10 rpm. After the crystal had grown to the desired size, it was drawn out of the liquid surface and cooled to room temperature at a rate of 20° C./h. Then the crystal was removed from the furnace and thus a potassium chloroborate ($K_3B_6O_{10}Cl$) nonlinear optical crystal with a size of 30 mm×26 mm×18 mm was obtained.

Example 3

Preparation of a $K_3B_6O_{10}Cl$ compound according to the following reaction equation:

$$K_2CO_3+KCl+6H_3BO_3 \rightarrow K_3B_6O_{10}Cl+CO_2\uparrow+9H_2O\uparrow$$

$K_2CO_3$, KCl and $H_3BO_3$ were put in a mortar at a molar ratio of 1:1:6, mixed and ground carefully, and then charged into a Φ100 mm×100 mm lidless corundum crucible. The crucible was placed in a muffle furnace, heated slowly to 350° C. and held at this temperature for 24 hours. After cooling down, the crucible was taken out at which time the sample was relatively loose. Subsequently, the sample was removed and ground thoroughly again. Then the sample was heated to 600° C. and held for 24 h, thereafter it was cooled to room temperature followed by grinding thoroughly, and then heated again to 720° C. and held for 48 hours. The sample was removed and ground in a mortar to yield a $K_3B_6O_{10}Cl$ compound. The compound was subjected to X-ray analysis, and the resultant X-ray pattern was consistent with the X-ray pattern obtained from potassium chloroborate $K_3B_6O_{10}Cl$ single crystal structure.

In the above reaction equation, potassium carbonate can be replaced by potassium oxide, potassium nitrate, potassium oxalate, potassium hydroxide or potassium bicarbonate; the boronic acid can be replaced by boron oxide.

The obtained $K_3B_6O_{10}Cl$ compound and a flux $K_2O$ were mixed at a molar ratio of $K_3B_6O_{10}Cl:K_2O=1:3$, then charged into a Φ80 mm×80 mm lidless platinum crucible, and then heated to 760° C. and held at this temperature for 30 h to obtain a mixed melting liquid of potassium chloroborate.

The temperature of the mixed melting liquid was reduced to 730° C., meanwhile a seed crystal rod was introduced rapidly under the surface of the mixed melting liquid. The temperature was reduced slowly to 630° C. at a rate of 5° C./h, then the seed crystal rod with an aggregate was lifted out of the liquid surface, and subsequently, cooled to room temperature at a rate of 8° C./h to obtain a potassium chloroborate seed crystal.

The obtained seed crystal was attached to the seed crystal rod and loaded from the top of a crystal growing furnace. First, the seed crystal was preheated above the surface of the mixed melting liquid at 725° C. for 5 min, and then partly dipped into the liquid surface so that the seed crystal remelted in the mixed melting liquid. After the temperature was maintained for 20 min, it was reduced quickly to a saturation temperature of 720° C.

The temperature was further reduced at a rate of 2° C./day while rotating the seed crystal rod at a rotation speed of 30 rpm. After the crystal had grown to the desired size, it was drawn out of the liquid surface and cooled to room temperature at a rate of 30° C./h. Then the crystal was removed from the furnace and thus a potassium chloroborate ($K_3B_6O_{10}Cl$) nonlinear optical crystal with a size of 30 mm×32 mm×28 mm was obtained.

Example 4

Preparation of a $K_3B_6O_{10}Cl$ compound according to the following reaction equation:

$$2KOH+KCl+6H_3BO_3 \rightarrow K_3B_6O_{10}Cl+10H_2O\uparrow$$

KOH, KCl and $H_3BO_3$ were put in a mortar at a molar ratio of 2:1:6, mixed and ground carefully, and then charged into a $\Phi100$ mm×100 mm lidless corundum crucible. The crucible was placed in a muffle furnace, heated slowly to 350° C. and held at this temperature for 24 hours. After cooling down, the crucible was taken out at which time the sample was relatively loose. Subsequently, the sample was removed and ground thoroughly again. Then the sample was heated to 600° C. and held for 24 h, thereafter it was cooled to room temperature followed by grinding thoroughly, and then heated again to 720° C. and held for 48 hours. The sample was removed and ground in a mortar to yield a $K_3B_6O_{10}Cl$ compound. The compound was subjected to X-ray analysis, and the resultant X-ray pattern was consistent with the X-ray pattern obtained from potassium chloroborate $K_3B_6O_{10}Cl$ single crystal structure.

In the above reaction equation, potassium hydroxide can be replaced by potassium carbonate, potassium nitrate, potassium oxalate, potassium oxide or potassium bicarbonate; the boronic acid can be replaced by boron oxide.

The obtained $K_3B_6O_{10}Cl$ compound and a flux PbO were mixed at a molar ratio of 1:4, then charged into a $\Phi80$ mm×80 mm lidless platinum crucible, and then heated to 720° C. and held at this temperature for 50 h to obtain a mixed melting liquid of potassium chloroborate.

The temperature of the mixed melting liquid was reduced to 705° C.; meanwhile a seed crystal rod was introduced rapidly under the surface of the mixed melting liquid. The temperature was reduced slowly to 630° C. at a rate of 1.5° C./h, then the seed crystal rod with an aggregate was lifted out of the liquid surface, and subsequently, cooled to room temperature at a rate of 10° C./h to obtain a potassium chloroborate seed crystal.

The obtained $K_3B_6O_{10}Cl$ seed crystal was attached to the seed crystal rod and loaded from the top of a crystal growing furnace. The seed crystal was preheated above the surface of the mixed melting liquid at 710° C. for 5 min in advance, and then dipped into the liquid surface so that the seed crystal remelted in the mixed melting liquid. After the temperature was maintained for 5 min, it was reduced quickly to a saturation temperature of 700° C.

The temperature was further reduced at a rate of 5° C./day while rotating the seed crystal rod at a rotation speed of 50 rpm. After the crystal had grown to the desired size, it was drawn out of the liquid surface and cooled to room temperature at a rate of 60° C./h. Then the crystal was removed from the furnace and thus a potassium chloroborate ($K_3B_6O_{10}Cl$) nonlinear optical crystal with a size of 32 mm×22 mm×16 mm was obtained.

Example 5

Preparation of a $K_3B_6O_{10}Cl$ compound according to the following reaction equation:

$$2KHCO_3+KCl+6H_3BO_3 \rightarrow K_3B_6O_{10}Cl+2CO_2\uparrow+10H_2O\uparrow$$

$KHCO_3$, KCl and $H_3BO_3$ were weighed at a molar ratio of 2:1:6 directly as starting materials. The weighed starting materials and a flux KF—PbO in which the molar ratio of KF to PbO is 3:1 were mixed at a molar ratio of 1:8, then charged into a ($\Phi80$ mm×80 mm lidless platinum crucible, and then heated to 800° C. and held at this temperature for 5 h to obtain a mixed melting liquid of potassium chloroborate.

The temperature of the mixed melting liquid was reduced to 700° C.; meanwhile a seed crystal rod was introduced rapidly under the surface of the mixed melting liquid. The temperature was reduced slowly to 620° C. at a rate of 5.5° C./h, and then the seed crystal rod with an aggregate was lifted out of the liquid surface. Subsequently, the temperature was reduced to room temperature at a rate of 12° C./h to obtain a potassium chloroborate seed crystal.

In the above reaction equation, potassium bicarbonate can be replaced by potassium carbonate, potassium nitrate, potassium oxalate, potassium hydroxide or potassium oxide; the boronic acid can be replaced by boron oxide.

The obtained $K_3B_6O_{10}Cl$ seed crystal was attached to the seed crystal rod and loaded from the top of a crystal growing furnace. The seed crystal was preheated above the surface of the mixed melting liquid at 700° C. for 15 min in advance, and then dipped into the liquid surface so that the seed crystal remelted in the mixed melting liquid. After the temperature was maintained for 35 min, it was reduced quickly to a saturation temperature of 695° C.

The temperature was reduced at a rate of 3° C./day while rotating the seed crystal rod at a rotation speed of 20 rpm. After the crystal had grown to the desired size, it was drawn out of the liquid surface and cooled to room temperature at a rate of 55° C./h. Then the crystal was removed from the furnace and thus a potassium chloroborate ($K_3B_6O_{10}Cl$) nonlinear optical crystal with a size of 33 mm×21 mm×10 mm was obtained.

Example 6

Preparation of a $K_3B_6O_{10}Cl$ compound according to the following reaction equation:

$$K_2O+KCl+3B_2O_3 \rightarrow K_3B_6O_{10}Cl$$

$K_2O$, KCl and $B_2O_3$ were weighed at a molar ratio of 1:1:3 directly as starting materials. The weighed starting materials and a flux KF—PbO in which the molar ratio of KF to PbO is 2:1 were mixed at a molar ratio of 1:3, then charged into a $\Phi80$ mm×80 mm lidless platinum crucible, and then heated to 690° C. and held at this temperature for 100 h to obtain a mixed melting liquid of potassium chloroborate.

The temperature of the mixed melting liquid was reduced to 655° C.; meanwhile a seed crystal rod was introduced rapidly under the surface of the mixed melting liquid. The temperature was reduced slowly to 660° C. at a rate of 8° C./h, and then the seed crystal rod with an aggregate was lifted out of the liquid surface. Subsequently, the temperature was reduced to room temperature at a rate of 10° C./h to obtain a potassium chloroborate seed crystal.

In the above reaction equation, the potassium oxide can be replaced by potassium carbonate, potassium nitrate, potassium oxalate, potassium hydroxide or potassium bicarbonate; the boron oxide can be replaced by boronic acid.

The obtained $K_3B_6O_{10}Cl$ seed crystal was attached to the seed crystal rod and loaded from the top of a crystal growing furnace. The seed crystal was preheated above the surface of the mixed melting liquid at 660° C. for 20 min in advance, and then dipped into the liquid surface so that the seed crystal remelted in the mixed melting liquid. After the temperature was maintained for 5 min, it was reduced quickly to a saturation temperature of 655° C.

The temperature was reduced at a rate of 5° C./day while rotating the seed crystal rod at a rotation speed of 100 rpm. After the crystal had grown to the desired size, it was drawn out of the liquid surface and cooled to room temperature at a rate of 80° C./h. Then the crystal was removed from the furnace and thus a potassium chloroborate ($K_3B_6O_{10}Cl$) nonlinear optical crystal with a size of 25 mm×21 mm×18 mm was obtained.

Example 7

Preparation of a $K_3B_6O_{10}Cl$ compound according to the following reaction equation:

$$K_2CO_3 + KCl + 3B_2O_3 \rightarrow K_3B_6O_{10}Cl + CO_2\uparrow$$

$K_2CO_3$, KCl and $B_2O_3$ were weighed at a molar ratio of 1:1:3 directly as starting materials. The weighed starting materials and a flux KF were mixed at a molar ratio of 1:5, then charged into a Φ80 mm×80 mm lidless platinum crucible, and then heated to 750° C. and held at this temperature for 75 h to obtain a mixed melting liquid of potassium chloroborate.

The temperature of the mixed melting liquid was reduced to 730° C.; meanwhile a seed crystal rod was introduced rapidly under the surface of the mixed melting liquid. The temperature was reduced slowly to 680° C. at a rate of 9° C./h, and then the seed crystal rod with an aggregate was lifted out of the liquid surface. Subsequently, the temperature was reduced to room temperature at a rate of 9° C./h to obtain a potassium chloroborate seed crystal.

In the above reaction equation, the potassium carbonate can be replaced by potassium bicarbonate, potassium nitrate, potassium oxalate, potassium hydroxide or potassium oxide; the boron oxide can be replaced by boronic acid.

The obtained seed crystal was attached to the seed crystal rod and loaded from the top of a crystal growing furnace. The seed crystal was preheated above the surface of the mixed melting liquid at 735° C. for 25 min in advance, and then dipped into the liquid surface so that the seed crystal remelted in the mixed melting liquid. After the temperature was maintained for 25 min, it was reduced quickly to a saturation temperature of 730° C.

The temperature was reduced at a rate of 4° C./day while rotating the seed crystal rod at a rotation speed of 70 rpm. After the crystal had grown to the desired size, it was drawn out of the liquid surface and cooled to room temperature at a rate of 60° C./h. Then the crystal was removed from the furnace and thus a potassium chloroborate ($K_3B_6O_{10}Cl$) nonlinear optical crystal with a size of 26 mm×25 mm×20 mm was obtained.

Example 8

Preparation of a $K_3B_6O_{10}Cl$ compound according to the following reaction equation:

$$2KNO_3 + KCl + 3B_2O_3 \rightarrow K_3B_6O_{10}Cl + NO_2\uparrow + NO\uparrow + O_2\uparrow$$

$KNO_3$, KCl and $B_2O_3$ were put in a mortar at a molar ratio of 2:1:3, mixed and ground carefully, and then charged into a Φ100 mm×100 mm lidless corundum crucible. The crucible was placed in a muffle furnace, heated slowly to 350° C. and held at this temperature for 24 hours. After cooling to room temperature, the crucible was taken out at which time the sample was relatively loose. Subsequently, the sample was removed and ground thoroughly again. Then the sample was heated to 600° C. and held for 24 h, thereafter it was cooled to room temperature followed by grinding, and heated again to 720° C. and held for 48 hours. The sample was then removed and ground slightly in a mortar to yield a $K_3B_6O_{10}Cl$ compound. The product was subjected to X-ray analysis, and the resultant X-ray pattern was consistent with the X-ray pattern obtained from a potassium chloroborate $K_3B_6O_{10}Cl$ single crystal structure.

In the above reaction equation, the potassium nitrate can be replaced by potassium carbonate, potassium bicarbonate, potassium oxalate, or potassium hydroxide; the boron oxide can be replaced by boronic acid.

The obtained $K_3B_6O_{10}Cl$ compound and a flux PbO were mixed at a molar ratio of 1:2, then charged into a Φ80 mm×80 mm lidless platinum crucible, and then heated to 770° C. and held at this temperature for 25 h to obtain a mixed melting liquid of potassium chloroborate.

The temperature of the mixed melting liquid was further reduced to 725° C.; meanwhile a seed crystal rod was introduced rapidly under the surface of the mixed melting liquid. The temperature was reduced slowly to 690° C. at a rate of 3.5° C./h, then the seed crystal rod with an aggregate was lifted out of the liquid surface, and subsequently, cooled to room temperature at a rate of 2.5° C./h to obtain a potassium chloroborate seed crystal.

The obtained $K_3B_6O_{10}Cl$ seed crystal was attached to the seed crystal rod and loaded from the top of a crystal growing furnace. The seed crystal was preheated above the surface of the mixed melting liquid at 725° C. for 8 min in advance, and then dipped into the liquid surface so that the seed crystal remelted in the mixed melting liquid. After the temperature was maintained for 8 min, it was reduced quickly to a saturation temperature of 720° C.

The temperature was reduced at a rate of 0.8° C./day while rotating the seed crystal rod at a rotation speed of 80 rpm. After the crystal had completed its growing, it was drawn out of the liquid surface and cooled to room temperature at a rate of 45° C./h. Then the crystal was removed from the furnace, thus a potassium chloroborate ($K_3B_6O_{10}Cl$) nonlinear optical crystal with a size of 26 mm×18 mm×15 mm was obtained.

Example 9

Preparation of a $K_3B_6O_{10}Cl$ compound according to the following reaction equation:

$$2KOH + KCl + 3B_2O_3 \rightarrow K_3B_6O_{10}Cl + 10H_2O\uparrow$$

KOH, KCl and $B_2O_3$ were put in a mortar at a molar ratio of 2:1:3, mixed and ground carefully, and then charged into a Φ100 mm×100 mm lidless corundum crucible. The crucible was placed in a muffle furnace, heated slowly to 350° C. and held at this temperature for 24 hours. After cooling to room temperature, the crucible was taken out at which time the sample was relatively loose. Subsequently, the sample was removed and ground thoroughly again. Then the sample was heated to 600° C. and held for 24 h, thereafter it was cooled to room temperature followed by grinding, and heated again to 720° C. and held for 48 hours. The sample was then removed and ground in a mortar to yield a $K_3B_6O_{10}Cl$ compound. The product was subjected to X-ray analysis, and the resultant X-ray pattern was consistent with the X-ray pattern obtained from potassium chloroborate $K_3B_6O_{10}Cl$ single crystal structure.

In the above reaction equation, the potassium hydroxide can be replaced by potassium carbonate, potassium bicarbonate, potassium oxalate, potassium nitrate or potassium oxide; the boron oxide can be replaced by boronic acid.

The obtained $K_3B_6O_{10}Cl$ compound and a flux $K_2O$ were mixed at a molar ratio of 1:2, then charged into a Φ80 mm×80 mm lidless platinum crucible, and then heated to 790° C. and held at this temperature for 8 h to obtain a mixed melting liquid of potassium chloroborate.

The temperature of the mixed melting liquid was further reduced to 750° C.; meanwhile a seed crystal rod was introduced rapidly under the surface of the mixed melting liquid. The temperature was reduced slowly to 650° C. at a rate of 6.5° C./h, then the seed crystal rod with an aggregate was lifted out of the liquid surface, and subsequently, cooled to room temperature at a rate of 10° C./h to obtain a potassium chloroborate seed crystal.

The obtained $K_3B_6O_{10}Cl$ seed crystal was attached to the seed crystal rod and loaded from the top of a crystal growing furnace. The seed crystal was preheated above the surface of the mixed melting liquid at 750° C. for 55 min in advance, and then dipped into the liquid surface so that the seed crystal remelted in the mixed melting liquid. After the temperature was maintained for 45 min, it was reduced quickly to a saturation temperature of 745° C.

The temperature was reduced at a rate of 1.5° C./day while rotating the seed crystal rod at a rotation speed of 60 rpm. After the crystal had completed its growing, it was drawn out of the liquid surface and cooled to room temperature at a rate of 35° C./h. Then the crystal was removed from the furnace, thus a potassium chloroborate ($K_3B_6O_{10}Cl$) nonlinear optical crystal with a size of 32 mm×20 mm×18 mm was obtained.

Example 10

Preparation of a $K_3B_6O_{10}Cl$ compound according to the following reaction equation:

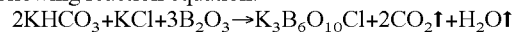
$2KHCO_3 + KCl + 3B_2O_3 \rightarrow K_3B_6O_{10}Cl + 2CO_2\uparrow + H_2O\uparrow$ $KHCO_3$, KCl and $B_2O_3$ were put in a mortar at a molar ratio of 2:1:3, mixed and ground carefully, and then charged into a Φ100 mm×100 mm lidless corundum crucible. The crucible was placed in a muffle furnace, heated slowly to 350° C. and held at this temperature for 24 hours. After cooling to room temperature, the crucible was taken out at which time the sample was relatively loose. Subsequently, the sample was removed and ground thoroughly again. Then the sample was heated to 600° C. and held for 24 h, thereafter it was cooled to room temperature followed by grinding, and heated again to 720° C. and held for 48 hours. The sample was then removed and ground in a mortar to yield a $K_3B_6O_{10}Cl$ compound. The product was subjected to X-ray analysis, and the resultant X-ray pattern was consistent with the X-ray pattern obtained from potassium chloroborate $K_3B_6O_{10}Cl$ single crystal structure.

In the above reaction equation, potassium bicarbonate can be replaced by potassium carbonate, potassium hydroxide, potassium oxalate, potassium nitrate or potassium oxide; the boron oxide can be replaced by boronic acid.

The obtained $K_3B_6O_{10}Cl$ compound and a flux KF were mixed at a molar ratio of 1:6, then charged into a Φ80 mm×80 mm lidless platinum crucible, and then heated to 700° C. and held at this temperature for 90 h to obtain a mixed melting liquid of potassium chloroborate.

The temperature of the mixed melting liquid was further reduced to 685° C.; meanwhile a seed crystal rod was introduced rapidly under the surface of the mixed melting liquid. The temperature was reduced slowly to 665° C. at a rate of 8° C./h, then the seed crystal rod with an aggregate was lifted out of the liquid surface, and subsequently, cooled to room temperature at a rate of 7° C./h to obtain a potassium chloroborate seed crystal.

The obtained $K_3B_6O_{10}Cl$ seed crystal was attached to the seed crystal rod and loaded from the top of a crystal growing furnace. The seed crystal was preheated above the surface of the mixed melting liquid at 680° C. for 60 min in advance, and then dipped into the liquid surface so that the seed crystal remelted in the mixed melting liquid. After the temperature was maintained for 60 min, it was reduced quickly to a saturation temperature of 675° C.

The temperature was reduced at a rate of 0.1° C./day while rotating the seed crystal rod at a rotation speed of 40 rpm. After the crystal had completed its growing, it was drawn out of the liquid surface and cooled to room temperature at a rate of 40° C./h. Then the crystal was removed from the furnace, thus a potassium chloroborate ($K_3B_6O_{10}Cl$) nonlinear optical crystal with a size of 26 mm×23 mm×18 mm was obtained.

Example 11

Preparation of a $K_3B_6O_{10}Cl$ compound according to the following reaction equation:

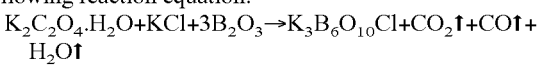
$K_2C_2O_4 \cdot H_2O + KCl + 3B_2O_3 \rightarrow K_3B_6O_{10}Cl + CO_2\uparrow + CO\uparrow + H_2O\uparrow$ $K_2C_2O_4 \cdot H_2O$, KCl and $B_2O_3$ were weighed at a molar ratio of 1:1:3 directly as starting materials. The weighed starting materials and a flux KF—PbO in which the molar ratio of KF to PbO is 3:1 were mixed at a molar ratio of 1:5, then charged into a Φ80 mm×80 mm lidless platinum crucible, and then heated to 710° C. and held at this temperature for 80 h to obtain a mixed melting liquid of potassium chloroborate.

The temperature of the mixed melting liquid was reduced to 695° C.; meanwhile a seed crystal rod was introduced rapidly under the surface of the mixed melting liquid. The temperature was reduced slowly to 600° C. at a rate of 2° C./h, and then the seed crystal rod with an aggregate was lifted out of the liquid surface. Subsequently, the temperature was reduced to room temperature at a rate of 3° C./h to obtain a potassium chloroborate seed crystal.

In the above reaction equation, potassium carbonate can be replaced by potassium bicarbonate, potassium nitrate, potassium oxalate, potassium hydroxide or potassium oxide; the boron oxide can be replaced by boronic acid.

The obtained seed crystal was attached to the seed crystal rod and loaded from the top of a crystal growing furnace. The seed crystal was preheated above the surface of the mixed melting liquid at 670° C. for 25 min in advance, and then partly dipped into the liquid surface so that the seed crystal remelted in the mixed melting liquid. After the temperature was maintained for 25 min, it was reduced quickly to a saturation temperature of 665° C.

The temperature was reduced at a rate of 3° C./day. After the crystal had grown to the desired size, it was drawn out of the liquid surface and cooled to room temperature at a rate of 15° C./h. Then the crystal was removed from the furnace and thus a potassium chloroborate ($K_3B_6O_{10}Cl$) nonlinear optical crystal with a size of 26 mm×25 mm×20 mm was obtained.

Example 12

A $K_3B_6O_{10}Cl$ crystal obtained in any one of Examples 1-11 was processed into a second harmonic device with a size of 5 mm×5 mm×6 mm according to the phase-matching orientation, and disposed at position 3 as shown in FIG. 3. At room temperature, when Q-switched Nd:YAG laser generator was used as the light source and the incident light had a wavelength of 1064 nm, an infrared light beam 2 with a wavelength of 1064 nm generated by the Q-switched Nd:YAG laser generator 1 irradiated into the $K_3B_6O_{10}Cl$ single crystal 3, resulting in a green second harmonic light with a wavelength of 532 nm which has an output intensity of about 3 times that of KDP under the same condition. The output light beam 4 contained an infrared light with a wavelength of 1064 nm and a green light with a wavelength of 532 nm, and it was filtered by filter 5 to obtain a green laser with a wavelength of 532 nm.

What is claimed is:

1. A potassium chloroborate nonlinear optical crystal, characterized in that, the crystal is a nonlinear optical crystal with a centimeter-grade size and has a chemical formula of $K_3B_6O_{10}Cl$, it has no symmetric center and belongs to rhombohedral crystal system, has a space group R3m with unit cell parameters of a=10.0624(14) Å, b=10.0624(14) Å, c=8.8361(18)Å, Z=3 and V=774.8(2) Å$^3$, and has a Mohs hardness of 4~5.

2. A method for preparing the potassium chloroborate nonlinear optical crystal as claimed in claim 1 wherein the potassium chloroborate nonlinear optical crystal is grown by using a flux, and the method comprises the steps of:

a. mixing a single-phase polycrystalline powder of a potassium chloroborate compound with a flux at a molar ratio of 1:2~8 uniformly, heating the obtained mixture gradually to 680~850° C. at a temperature-increasing rate of 1~30° C./h, and maintaining this temperature for 5~100 hours to obtain a mixed melting liquid;

or weighing a starting material for preparing a potassium chloroborate single-phase polycrystalline powder according to a molar ratio directly, and then mixing the starting material for preparing a potassium chloroborate single-phase polycrystalline powder with a flux at a molar ratio of 1:2~8 uniformly, heating the obtained mixture to 680~850° C. at a temperature-increasing rate of 1~30° C./h, and maintaining this temperature for 5~100 hours to obtain a mixed melting liquid;

the starting material for preparing a potassium chloroborate single-phase polycrystalline powder and the formulation thereof is at least one of the following:

formulation 1: a potassium-containing starting material A, KCl and a boron-containing compound at a molar ratio of 1:1:6, wherein the potassium-containing material A is potassium carbonate or potassium oxide; the boron-containing compound is boronic acid or boron oxide;

formulation 2: a potassium-containing starting material B, KCl and boronic acid at a molar ratio of 2:1:6, wherein the potassium-containing material B is potassium nitrate, potassium hydroxide or potassium bicarbonate;

formulation 3: a potassium-containing starting material C, KCl and boron oxide at a molar ratio of 2:1:3, wherein the potassium-containing material C is potassium nitrate, potassium hydroxide or potassium bicarbonate; or formulation 4: a potassium-containing starting material D, KCl and boron oxide at a molar ratio of 1:1:3, wherein the potassium-containing material D is potassium bicarbonate, potassium oxide or potassium oxalate;

the flux is KF, $K_2O$, PbO or KF—PbO;

b. reducing the temperature of the mixed melting liquid to 655~750° C., introducing the lower end of a seed crystal rod under the surface of the mixed melting liquid, reducing the temperature slowly by 5~100° C. at a rate of 0.5~10° C./h, lifting the seed crystal rod with an aggregate at its lower end out of the liquid surface, and then reducing to room temperature at a rate of 0~12° C./h to obtain a potassium chloroborate seed crystal which aggregates at the lower end of the seed crystal rod;

c. putting a crucible containing the mixed melting liquid obtained in step a. a crystal growing furnace, and loading the seed crystal obtained in step b. the top of the furnace, after 5~60 min of preheating, contacting the seed crystal with the mixed melting liquid surface or lowering it into the mixed melting liquid for remelting, holding the temperature for 5~60 min, and then reducing to saturation temperature at a rate of 1~60° C./h; and d. further reducing the temperature at a rate of 0.1~5° C./day while rotating the seed crystal rod or the crucible at a rotation speed of 0~100 rpm for crystal growing, after the single crystal has grown up to the desired size, lifting the crystal out of the melting liquid surface and reducing the temperature to room temperature at a rate of 1~80° C./h, and then removing the crystal from the furnace, thus obtaining a potassium chloroborate nonlinear optical crystal.

3. The method for preparing the potassium chloroborate nonlinear optical crystal of claim 1, characterized in that, the single-phase polycrystalline powder of the potassium chloroborate compound is prepared by a solid-state reaction with the steps of:

subjecting the starting material for preparing a potassium chloroborate single-phase polycrystalline powder at a molar ratio of K:Cl:B=3:1:6 to: uniformly mixing, grinding followed by heating at 350° C. for 24 hours in a muffle furnace, cooling to room temperature; the second grinding, heating at 600° C. for 24 hours in a muffle furnace, cooling to room temperature; the third grinding, heating at 720° C. for 48 hours in a muffle furnace, cooling to room temperature; removing and grinding so as to obtain a completely sintered single-phase polycrystalline powder of a potassium chloroborate compound.

4. The method for preparing the potassium chloroborate nonlinear optical crystal of claim 1, characterized in that, the preparation of the single-phase polycrystalline powder of the potassium chloroborate compound by a solid-state reaction is performed according to at least one of the following reaction equations:

(1) $K_2CO_3+KCl+6H_3BO_3 \rightarrow K_3B_6O_{10}Cl+CO_2\uparrow+9H_2O\uparrow$
(2) $2KNO_3+KCl+6H_3BO_3 \rightarrow K_3B_6O_{10}Cl+NO_2\uparrow+NO\uparrow+9H_2O\uparrow+O_2\uparrow$
(3) $K_2O+KCl+6H_3BO_3 \rightarrow K_3B_6O_{10}Cl+9H_2O\uparrow$
(4) $2KOH+KCl+6H_3BO_3 \rightarrow K_3B_6O_{10}Cl+10H_2O\uparrow$
(5) $2KHCO_3+KCl+6H_3BO_3 \rightarrow K_3B_6O_{10}Cl+2CO_2\uparrow+10H_2O\uparrow$
(6) $K_2CO_3+KCl+3B_2O_3 \rightarrow K_3B_6O_{10}Cl+CO_2\uparrow$
(7) $2KNO_3+KCl+3B_2O_3 \rightarrow K_3B_6O_{10}Cl+NO_2\uparrow+NO\uparrow+O_2\uparrow$
(8) $K_2O+KCl+3B_2O_3 \rightarrow K_3B_6O_{10}Cl$
(9) $2KOH+KCl+3B_2O_3 \rightarrow K_3B_6O_{10}Cl+H_2O\uparrow$
(10) $2KHCO_3+KCl+3B_2O_3 \rightarrow K_3B_6O_{10}Cl+2CO_2\uparrow+H_2O\uparrow$
(11) $K_2C_2O_4 \cdot H_2O+KCl+3B_2O_3 \rightarrow K_3B_6O_{10}Cl+CO_2\uparrow+CO\uparrow+H_2O\uparrow$.

5. The method for preparing the potassium chloroborate nonlinear optical crystal according to claim 2, characterized in that, the molar ratio of KF to PbO in the KF—PbO flux of the step a is 1~5:1~4.

6. A use of the potassium chloroborate nonlinear optical crystal of claim 1 in a frequency converting device for laser output of a laser generator.

7. A use of the potassium chloroborate nonlinear optical crystal of claim 1 in generating a second, third, fourth or fifth harmonic light output for a laser beam with a wavelength of 1064 nm.

8. A use of the potassium chloroborate nonlinear optical crystal of claim 1 in a harmonic generator in a range of ultraviolet, an optical parametric and amplifying device, and a light-waveguide device.

* * * * *